US008969773B2

(12) United States Patent
Peizerat et al.

(10) Patent No.: US 8,969,773 B2
(45) Date of Patent: Mar. 3, 2015

(54) CMOS IMAGING DEVICE WITH THREE-DIMENSIONAL ARCHITECTURE HAVING READING CIRCUITS AND AN ELECTRONIC PROCESSING CIRCUIT ARRANGED ON DIFFERENT SUBSTRATES

(75) Inventors: Arnaud Peizerat, Grenoble (FR); Yvon Cazaux, Grenoble (FR); Michäel Tchagaspanian, Saint Ismier (FR)

(73) Assignee: Commissariat à l énergie atomque et aux énergies alternatives, Paris (FR)

( * ) Notice: Subject to any disclaimer, the term of this patent is extended or adjusted under 35 U.S.C. 154(b) by 254 days.

(21) Appl. No.: 13/637,223

(22) PCT Filed: Mar. 25, 2011

(86) PCT No.: PCT/EP2011/054594
§ 371 (c)(1),
(2), (4) Date: Nov. 8, 2012

(87) PCT Pub. No.: WO2011/117376
PCT Pub. Date: Sep. 29, 2011

(65) Prior Publication Data
US 2013/0048832 A1 Feb. 28, 2013

(30) Foreign Application Priority Data
Mar. 26, 2010 (FR) ..................... 10 52222

(51) Int. Cl.
*H01L 27/00* (2006.01)
*H01L 27/146* (2006.01)
(52) U.S. Cl.
CPC .... *H01L 27/14634* (2013.01); *H01L 27/14636* (2013.01); *H01L 27/1469* (2013.01);
(Continued)

(58) Field of Classification Search
USPC ........... 250/208.1, 214 R, 239; 348/281–314; 257/291, 292, 440, 293, 191, 225–234
See application file for complete search history.

(56) References Cited

U.S. PATENT DOCUMENTS 7,498,624 B2 * 3/2009 Suzuki .......................... 257/292
2007/0096233 A1 5/2007 Jeon
(Continued)

FOREIGN PATENT DOCUMENTS

EP 1 883 112 A1 1/2008
JP 2009-170448 A 7/2009

OTHER PUBLICATIONS

French Preliminary Search Report issued Nov. 15, 2010 in French Patent Application No. 1052222 (with English Translation of Categories of Cited Documents).
A.W. Topol, et al., "Three-dimensional integrated circuits", IBM Journal of Research & Development, vol. 50, No. 4/5, Jul.-Sep. 2006, pp. 491-506.

(Continued)

*Primary Examiner* — Que T Le
(74) *Attorney, Agent, or Firm* — Oblon, McClelland, Maier & Neustadt, L.L.P.

(57) ABSTRACT

An imaging device including: plural pixels each including a photodetector; plural reading circuits associated with the plural photodetectors, each reading circuit including a first MOS transistor charging/discharging a photodetector and a second MOS transistor converting charges to be output by the photodetector into voltage; an electronic processing circuit configured to process the voltages outputted by the reading circuits; a first substrate on which are formed the pixels and the reading circuits, and a second substrate, distinct from the first substrate, on which is formed the electronic processing circuit, the second substrate being linked electrically to the first substrate by an electrical interconnection forming an electrical link between the reading circuits and the electronic processing circuit.

9 Claims, 6 Drawing Sheets

(52) U.S. Cl.
CPC ..... *H01L27/14603* (2013.01); *H01L 27/14609* (2013.01); *H01L 27/14632* (2013.01); *H01L 27/14643* (2013.01); *H01L 27/14689* (2013.01)
USPC .................................. 250/208.1; 250/214 R

(56) References Cited

U.S. PATENT DOCUMENTS

| | | |
|---|---|---|
| 2008/0017946 A1 | 1/2008 | Cazaux et al. |
| 2008/0083939 A1 | 4/2008 | Guidash |
| 2008/0284888 A1 | 11/2008 | Kobayashi |
| 2009/0230287 A1 | 9/2009 | Anderson et al. |
| 2009/0242950 A1 | 10/2009 | McCarten et al. |
| 2010/0248412 A1 | 9/2010 | Guidash |

OTHER PUBLICATIONS

Vyshnavi Suntharalingam, et al., "Megapixel CMOS Image Sensor Fabrication in Three-Dimensional Integrated Circuit Technology", 2005 IEEE International Solid-States Circuits Conference, Digest of technical papers (ISSCC 2005), 2005, pp. 356-357.

H. Kurino, et al., "Intelligent Image Sensor Chip with Three Dimensional Structure", IEEE 1999, IEDM 99, pp. 879-882.

Pierre Magnan, et al., "Amélioration et modélisation des performances des capteurs d'images CMOS", RSTD 63, Mar. 2004, pp. 71-86 (with English Abstract).

International Search Report issued May 24, 2011, in PCT/EP2011/054594.

Office Action issued Nov. 18, 2013 in European Patent Application No. 11 709 958.0.

\* cited by examiner

CMOS IMAGING DEVICE WITH THREE-DIMENSIONAL ARCHITECTURE HAVING READING CIRCUITS AND AN ELECTRONIC PROCESSING CIRCUIT ARRANGED ON DIFFERENT SUBSTRATES

CROSS-REFERENCE TO RELATED APPLICATION

This application is a national phase application based on PCT/EP2011/054594, filed on Mar. 25, 2011. This application is also based upon and claims the benefit of priority under 35 U.S.C. §119 from prior French Patent Application No. 10 52222, filed on Mar. 26, 2010. The entire contents of each of the above applications are incorporated herein by reference.

TECHNICAL FIELD

The invention relates to the field of imaging devices, or image sensors, of CMOS (complementary metal oxide semiconductor) type and produced in 3D technology (in three dimensions), in other words comprising an architecture formed of several superimposed substrates.

The invention applies particularly to CMOS imaging devices produced in silicon technology, comprising pixels of small sizes, and able to perform optical detection in the visible domain.

PRIOR ART

A CMOS imaging device is an integrated circuit, conventionally constituted of an array of pixels and a control electronic.

Each pixel comprises a photodetector intended to convert the energy of the incident photons received by the pixel into electron-hole pairs, an integration capacitance which stores the charges generated and several (metal oxide semiconductor) MOS transistors.

The control electronic is responsible in particular for evacuating in a series manner, in other words pixel by pixel, the electrical information outputted by each pixel up to the output of the array.

Traditionally, a CMOS imaging device is produced in the form of a 2D chip (in two dimensions) comprising all of the components thereof (pixels and control electronic) on a single semi-conductor substrate, for example composed of silicon.

With the rapid development of 3D technology, it is possible to produce integrated circuits in the form of stacks of several layers. For example, the document "Three-dimensional integrated circuits" of A. W. Topol, IBM Journal of Research & Development, vol. 50, n° 4/5, July-September 2006, describes the production of integrated circuits in the form of 3D chips obtained from the stacking and the interconnection of several 2D chips.

An integrated circuit produced in the form of a 3D chip has notably the advantage, compared to a similar integrated circuit but produced in the form of a 2D chip, of reducing the length of the necessary electrical interconnections, thus reducing the data transfer times between the different components of the chip. For a system requiring several chips, 3D technology makes it possible to increase the number of interconnections between the chips, and thus to have a communication no longer series but massively parallel between the superimposed chips.

The document "Megapixel CMOS image sensor fabricated in three-dimensional integrated circuit technology" of V. Suntharalingam et al., 2005 International Solid-State Circuits Conference, Digest of Technical Papers (ISSCC 05), IEEE Press, 2005, pages 356-357, describes the production of an imaging device using the principle of integrated circuits produced in the form of 3D chips.

The photodiodes are formed at the level of a first substrate which is stacked on a second substrate comprising the analog electronic of the pixels (reading circuits of the photodiodes and pixel selection means), the second substrate being itself stacked on a third substrate on which is formed the digital electronic for processing signals.

Said substrates are electrically connected together by traversing vias.

Due to the fact that the first substrate only comprises photodiodes, a ratio of 100% is obtained between the useful photodetection surface area of the photodiodes and the total surface area of the pixels.

Nevertheless, such a conception does not make it possible to produce a high performance imaging device comprising pixels of small size, for example of dimensions less than or equal to around 2 μm (this dimension corresponding to the dimension of a side of a square shaped pixel). In fact, given the photodiodes are connected to the reading circuits by way of traversing vias, said vias add parasitic capacitances to the junction capacitance, or reading capacitance, formed by the photodiode, reducing in a problematic manner the signal/noise ratio obtained at the output of the reading circuit. However, for pixels of small size, it is imperative that the junction capacitances remain very low (for example less than or equal to around 1.5 fF). However, such a device does not make it possible to obtain such values in terms of junction capacitances.

DESCRIPTION OF THE INVENTION

An aim of the present invention is to propose an imaging device having the advantages provided by a three-dimensional architecture and which is compatible with the production of pixels of small dimensions and very high performances, particularly in terms of sensitivity.

To do this, the present invention proposes an imaging device comprising at least:
- a plurality of pixels, each pixel comprising at least one photodetector,
- a plurality of reading circuits associated with the plurality of photodetectors, each reading circuit comprising at least one circuit for converting charges intended to be outputted by at least one of the photodetectors into voltage,
- at least one electronic processing circuit able to process the voltages intended to be outputted by the reading circuits,
- the imaging device comprising at least one first substrate on which are formed the pixels and the reading circuits, and at least one second substrate, distinct from the first substrate, on which is formed the electronic processing circuit, the second substrate being linked electrically to the first substrate by way of at least one electrical interconnection forming an electrical link between the reading circuits and the electronic processing circuit.

The terms "first substrate" and "second substrate" respectively designate a first layer of material and a second layer of material distinct from the first layer, for example composed of at least one semi-conductor material, and which are, in the imaging device according to the invention, electrically connected together by at least one electrical interconnection and advantageously superimposed one on top of the other.

Thus, thanks to the three-dimensional architecture of the imaging device (components spread out on the first and the second substrates which may be superimposed one above the other), the electronic processing circuit of the imaging device is associated with a plurality of pixels, which is very appropriate for the processing operations that an image captured by the imaging device have to undergo: analog—digital conversion of the signals outputted by the pixels, compression, detection of contours, detection of movements, etc. The operations carried out by the processing circuit may correspond to the operations performed on the signals outputted by the reading circuits, after said signals have been multiplexed.

The imaging device according to the invention moreover makes it possible to relieve the constraints on the electrical interconnections between the first and the second substrate. In fact, for each pixel, all of the components directly connected to the reading node, in other words the node at the level of which is performed the conversion of the charges generated by the photodetector into voltage, said components forming the circuit for converting charges into voltage, are formed on the first substrate which also comprises the photodetectors, the connection to the second substrate by the electrical interconnection(s) being formed downstream of said conversion of charges.

Thus, due to the fact that all of the components of the reading circuit are formed on the first substrate, the electrical interconnection(s) between substrates do not add parasitic capacitance to the storage capacitances of the charges generated by the photodetectors, which renders such an imaging device compatible with the production of pixels of small size. The imaging device according to the invention thus comprises a three-dimensional architecture in which the performances, such as the signal/noise ratio obtained, are not degraded by the addition of a capacitance due to the electrical connection between the two substrates of the device.

Nevertheless, the imaging device according to the invention is also compatible with the production of pixels of larger size.

The imaging device according to the invention can use configurations of existing pixels for which optimisation phases have been carried out.

In such a device, the photodetectors and the analog electronic of the pixels such as the reading circuit are conserved on the first substrate, the digital processing being carried out at the level of the second substrate.

This conception enables the production of a 3D imaging device that can reuse, with a minimum of modifications, the optimised designs of existing pixels of 2D imaging devices.

Each pixel may comprise one of the reading circuits electrically connected to the photodetector and to an output of said pixel. Thus, it is possible that the imaging device comprises charge transfer pixels, which are high sensitivity pixels, in which a charge transfer photodiode is associated with a MOS transfer transistor, said two components being formed on a same substrate.

Each reading circuit comprises at least:
  a first MOS transistor able to carry out charging and discharging of the photodetector associated with said reading circuit, and
  a second MOS transistor or a charge amplifier, forming the circuit for converting charges into voltage of said reading circuit.

Each reading circuit comprises all of the components directly connected to the reading node, in other words the node on which is carried out the conversion of the charges into voltage. For example, in the case of a 3T type pixel, said components correspond at least to the transistor enabling charging and discharging of the photodetector, and to the voltage follower transistor. In the case of a pixel of 4T type, said components comprise in addition, compared to those of a 3T pixel, at least one other transfer, or isolation, MOS transistor making it possible to carry out directly the integration of the charges generated by the photodetector during the discharge of the junction capacitance of the photodetector.

Due to the fact that the reading circuits are formed on the first substrate, the reading capacitances corresponding to the series of capacitances connected to the gate of the second MOS transistor or to the charge amplifier are present in totality on the first substrate. Thus, unlike an imaging device in which the components carrying out the charges—voltage conversion would be spread out on the two substrates, thus adding additional capacitances due to the electrical links between the two substrates to the reading capacitances, the capacitances formed by the electrical links between the two substrates of the imaging device according to the invention are not added to the reading capacitances.

The junction capacitances of the photodetectors form a part of the reading capacitances but do not form the totality of said reading capacitances. The capacitances formed by the electrical links between the photodetectors and the MOS transistor or the charge amplifier also form part of the reading capacitances.

Each pixel may moreover comprise at least one MOS isolation transistor formed on the first substrate, between the photodetector of said pixel and the reading circuit associated with said photodetector.

Each pixel may comprise one of the reading circuits distinct from the reading circuits of the other pixels.

The imaging device may moreover comprise at least one multiplexing circuit formed on the second substrate and being able to form first pixel selection means, the reading circuits being able to be electrically connected to the electronic processing circuit by way of the multiplexing circuit, an output of the multiplexing circuit being connected to at least one input of the electronic processing circuit by at least one interconnection bus formed on the second substrate.

Each reading circuit may be electrically connected to the second substrate by an electrical interconnection distinct from the electrical interconnections connecting the other reading circuits to the second substrate.

The pixels may be laid out in an array and the outputs of the pixels of a same column of the array may be electrically connected to each other by a connection bus formed on the first substrate.

Each connection bus may be electrically connected to an electrical interconnection distinct from the electrical interconnections connected to the other connection buses and formed between the first substrate and the second substrate, the electrical interconnections being able to electrically connect the connection buses to inputs of the multiplexing circuit.

The pixels may be laid out in an array and the outputs of the pixels of a same column of the array may be electrically connected to each other by a connection bus formed on the first substrate, the connection buses being able to be electrically connected to each other and to the electrical interconnection, each pixel being able moreover to comprise at least one MOS transistor laid out between the reading circuit of said pixel and the connection bus to which is connected said pixel and forming first pixel selection means.

The imaging device may moreover comprise second pixel selection means cooperating with the first pixel selection means so that the electronic processing circuit receives successively in input the voltages intended to be outputted by the reading circuits, the second pixel selection means being able to be formed by the multiplexing circuit and/or by the first MOS transistor of the reading circuit and/or by another MOS transistor formed on the first substrate and laid out between the reading circuit of said pixel and the connection bus to which is connected said pixel.

Several pixels may be electrically connected to a same reading circuit, each pixel being able to comprise first pixel selection means laid out between the photodetector of said pixel and the reading circuit, an output of the reading circuit being able to be connected to second pixel selection means cooperating with the first pixel selection means so that the electronic processing circuit receives successively in input the voltages intended to be outputted by the reading circuits.

The plurality of pixels may form a macropixel, the imaging device being able to comprise a plurality of macropixels formed on the first substrate and a plurality of electronic processing circuits formed on the second substrate, each macropixel being able to be electrically connected to one of the electronic processing circuits by way of at least one distinct electrical interconnection being able to electrically connect the first substrate to the second substrate.

The electronic processing circuit(s) may be able to carry out at least one analog—digital conversion of the signals intended to be outputted by the reading circuits of the pixels.

The electrical interconnection(s) may comprise electrically conductive beads electrically connecting the electrical contacts of the first substrate to electrical contacts of the second substrate, and/or electrical contacts of the first substrate bonded by molecular adhesion to electrical contacts of the second substrate, and/or traversing vias formed through the first substrate and/or the second substrate.

BRIEF DESCRIPTION OF DRAWINGS

The present invention will be better understood on reading the description of embodiment examples given for purely indicative purposes and in no way limiting and by referring to the appended drawings in which.

Identical, similar or equivalent parts of the different figures described hereafter bear the same numerical references in order to make it easier to go from one figure to the next.

The different parts represented in the figures are not necessarily shown at a uniform scale in order to make the figures easier to read.

The different possibilities (variants and embodiments) must be understood as not being mutually exclusive and may be combined together.

DETAILED DESCRIPTION OF PARTICULAR EMBODIMENTS

Figure 1:
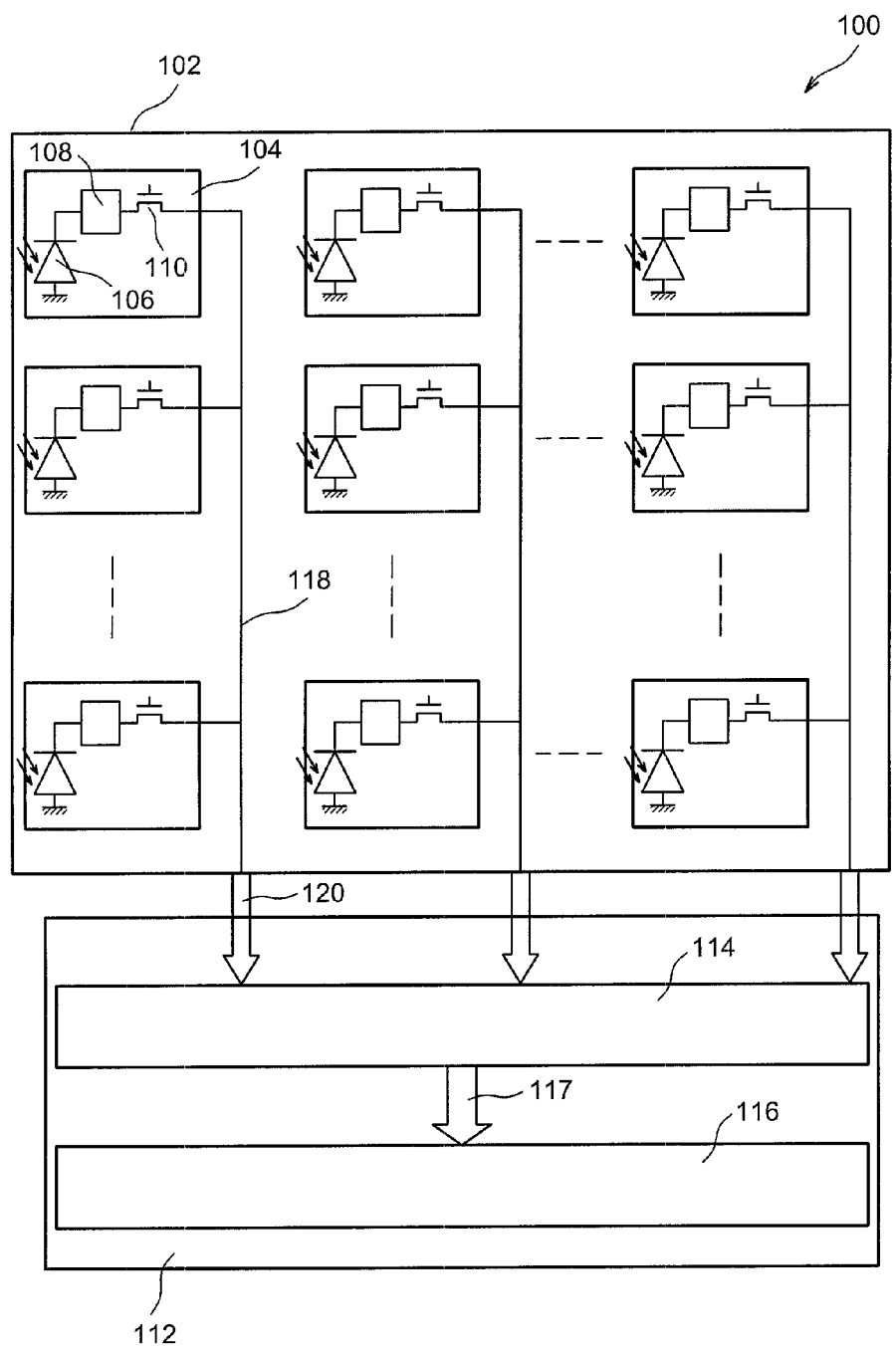
FIGS. 1 and 5 to 7 schematically and partially represent imaging devices, subject matters of the present invention, according to three different embodiments.

Reference is firstly made to FIG. 1 which schematically and partially represents an imaging device 100 according to a first embodiment.

The imaging device 100 comprises a first substrate 102, for example composed of a semi-conductor material such as silicon, on which is formed a detection circuit of the imaging device 100 formed by a plurality of pixels 104 laid out in the form of an array of n lines and m columns.

Although in FIG. 1 only nine pixels 104 are represented, the imaging device 100 comprises a much greater number of pixels 104, for example several million or several tens of million. In the example of FIG. 1, the pixels 104 each have a square shape, the sides of which have a dimension substantially equal or less than around 2 µm.

Each pixel 104 comprises a photodetector, for example a photodiode 106, intended to convert the energy of incident photons received by each of the pixels 104 into electron-hole pairs.

In a variant, the photodetectors of the imaging device 100 could be phototransistors.

Each pixel 104 of the imaging device 100 also comprises a reading circuit 108 of the charges generated by the photodiode 106. Said reading circuit 108 particularly comprises a circuit assuring the charge and the discharge of the photodiode 106 as well as the conversion of the charges generated by the photodiode 106 and stored in the junction capacitance of the photodiode 106 during an exposure time of the pixel 104 to voltage.

Finally, each pixel 104 also comprises first pixel selection means making it possible, by sequentially selecting the pixels 104, to read sequentially the information detected by the different pixels of the imaging device 100.

In the example of FIG. 1, said first selection means comprise, in each pixel 104, an MOS transistor 110 making it possible, when all of the MOS transistors 110 of a same line of pixels 104 are turned on, to select said line and to read the information of the pixels 104 of said line, in other words to read the signals detected by the pixels 104 of said line.

The conversion of the charges generated by the photodetectors into voltage, carried out by the circuits for converting charges into voltage 108, is performed between the photodetectors 106 and the first pixel selection means 110 which are on the first substrate 102. The function for converting charges is thus not transferred onto another substrate, thus not perturbing the performances of the imaging device compared to an imaging device that would comprise all the components thereof formed on a single substrate.

The lines of the array of pixels 104 are read sequentially one after the other.

In a variant, it is possible that said first pixel selection means are not formed by the MOS transistors 110 connected to the outputs of the reading circuits 108, but by an MOS transistor (referenced 122 in the examples represented in FIGS. 2 and 4) present in each reading circuit 108 and which can also serve to carry out the charge and the discharge of the photodetector 106 of the pixel 104.

The imaging device 100 also comprises a second substrate 112 on which are formed multiplexing circuits 114 and electronic processing circuits 116, the multiplexing circuits 114 being electrically connected to the electronic processing circuits 116 by way of buses 117 formed on the second substrate 112. In the example of FIG. 1, a single multiplexing circuit 114 and a single electronic processing circuit 116 connected together by a bus 117 are represented.

The voltages outputted by the pixels 104 are routed to the multiplexing circuits 114 by way of buses 118 and electrical interconnections 120.

The buses 118 are formed on the first substrate 102 whereas the electrical interconnections 120 are formed between the first substrate 102 and the second substrate 112.

To carry out the processing of the voltages outputted by the series of pixels 104 of the imaging device 100, said pixels 104 are grouped together in order to form several groups of pixels 104, each group of pixels 104 forming a "macropixel". Each macropixel may be associated with a multiplexing circuit 114 and with a specific electronic processing circuit 116.

The pixels 104 represented in FIG. 1 form part of a same macropixel forming an array of 16×16 pixels, i.e. 256 pixels, of which only nine pixels 104 are represented in FIG. 1.

The outputs of the pixels 104 of a same column of a macropixel are electrically connected to a shared bus 118, each bus 118 being connected to an electrical interconnection 120. In the example of FIG. 1, each macropixel of the imaging device 100 is thus electrically connected to the second substrate 112 by way of sixteen buses 118 connected to sixteen electrical interconnections 120, i.e. an electrical interconnection 120 for each column of pixels 104 of a macropixel.

During an image acquisition, the lines of pixels 104 of the imaging device 100 are addressed sequentially one after the other.

This addressing is performed by way of MOS transistors 110 that each pixel 104 comprises or by one of the MOS transistors of the reading circuit 108 of each pixel 104. Thus, in the macropixel represented in FIG. 1, when the pixels 104 of a same line are addressed, a voltage corresponding to a signal detected by a pixel 104 is thus emitted on each of the buses 118, and then transmitted to the multiplexing circuit 114 by way of electrical interconnections 120. Given that the electronic processing circuit 116 cannot process sixteen signals simultaneously, the multiplexing circuit 114 forms second pixel selection means making it possible to send sequentially to the electronic processing circuit 116 the voltages received from each of the electrical interconnections 120. Thus, the MOS transistors forming the first pixel selection means cooperate with the multiplexing circuit 114, which forms second pixel selection means, so that the electronic processing circuit 116 receives successively in input the voltages outputted by the reading circuits 108 of each pixel 104.

The electronic processing circuit 116 may enable an analog—digital conversion of the signals received to be carried out, and potentially other functions such as a memorisation and/or a digital pre-processing of the voltages outputted by the pixels (for example a function of stabilisation of image, a video acceleration, detection of movement, detection of contour, compression of data, etc.).

The necessary place on the second substrate 112 to form the electronic processing circuits 116 is linked to the complexity of the function(s) implemented by said circuits 116. Thus, as a function of the complexity of the function(s) fulfilled by the electronic processing circuits 116, it will be possible to reduce more or less the dimensions of the pixels 104 of the imaging device 100.

The electrical interconnections 120 may be formed in different ways. In a first embodiment, said electrical interconnections 120 may be formed by electrically conductive beads electrically connecting electrical contacts of the first substrate 102 (said contacts forming bus output pads 118) to electrical contacts of the second substrate 112 (said contacts forming input pads of the multiplexing circuit 114).

To form such electrical interconnections, beads of electrically conductive material are firstly laid out on the contacts of one of the two substrates 102, 112, or spread out on the contacts of the two substrates 102, 112.

The substrates 102, 112 are then positioned so that the electrical contacts of the two substrates are laid out facing each other, separated by the beads of electrically conducting material.

A heat treatment is then carried out to melt the beads, the two substrates being welded to each other by way of electrical interconnections 120 formed by the melted then solidified conductive material of the beads.

In a second embodiment, the electrical interconnections 120 may be formed by a molecular bonding performed between the two substrates 102, 112, the electrical contacts of the two substrates 102 and 112 then joined together by said bonding. Such a molecular bonding is obtained by carrying out firstly a planarization of the two substrates, then placing in contact the two substrates. An annealing enables the join between the two substrates 102 and 112 to be made.

Whatever the technique used to join the first substrate 102 to the second substrate 112, or even if it is wished that the two substrates 102 and 112 are not joined to each other but simply brought close to each other, the electrical interconnections 120 may also be formed by traversing vias formed through the substrates 102 and 112.

When the electrical interconnections 120 are formed by way of beads of electrically conductive material or by carrying out a molecular bonding of the two substrates 102 and 112, the front face of the first substrate 102, the face on which are formed the electronic components of the pixels 104, is laid out facing the second substrate 112 (because the electrical contacts of the two substrates 102, 112 must be laid out facing each other).

It is necessary in this case to carry out a thinning of the first substrate 102 so that the photodetection can be carried out from the rear face of the first substrate 102 which is intended to be illuminated. Said thinning enables light to traverse the first substrate 102 in order to illuminate the photodiodes 106 of the pixels 104.

Figure 2:
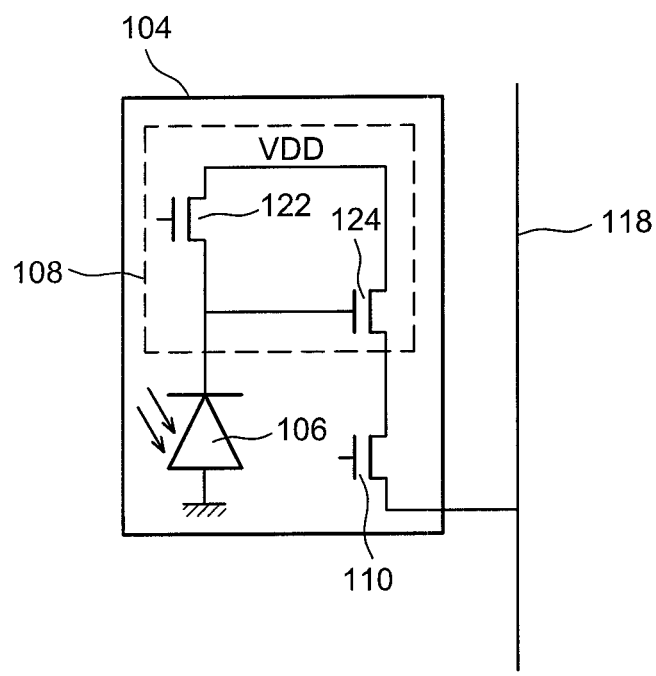
FIGS. 2 to 4 represent embodiment examples of reading circuits of a pixel of an imaging device, subject matter of the present invention.
Figure 3:
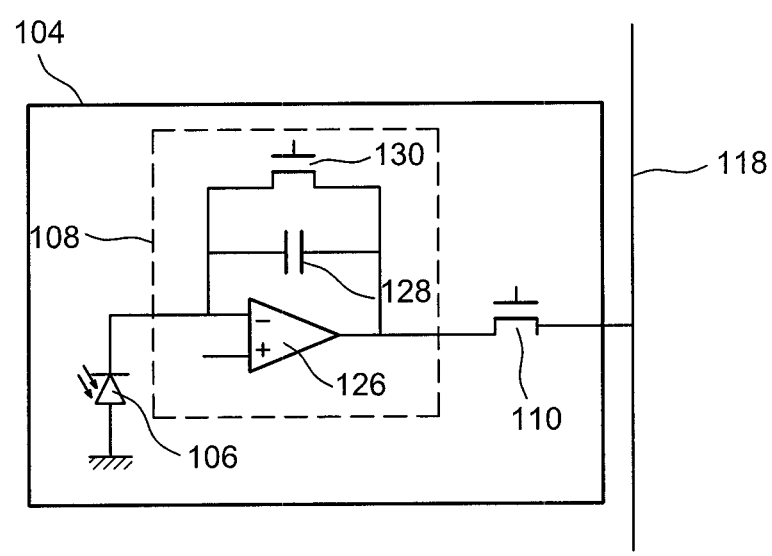
Figure 4:
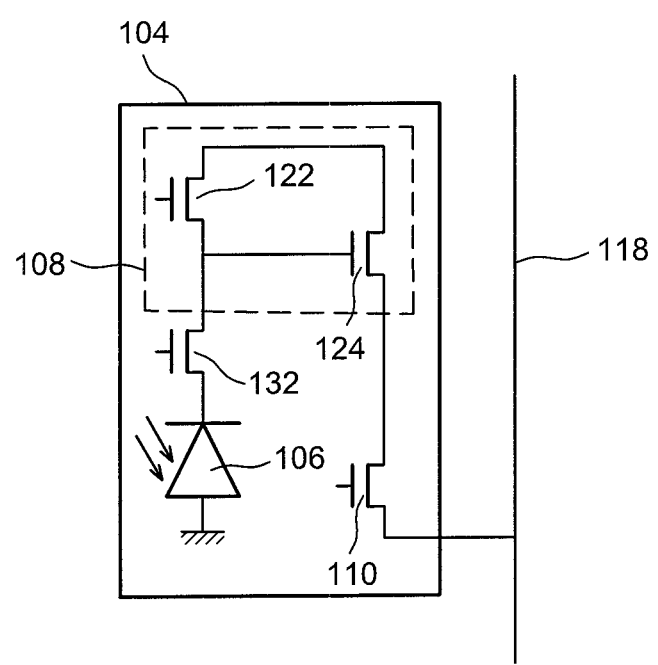

With reference to FIGS. 2 to 4, several embodiment examples of a pixel 104 of the imaging device 100 each comprising a different reading circuit 108 are described.

A first embodiment example of a pixel 104 comprising a photodiode 106 and a reading circuit 108 electrically connected to the photodiode 106 and to the MOS transistor 110 for selecting pixel line is represented in FIG. 2.

In this first example, the pixel 104 is an active pixel of 3T type, in other words comprising an analog electronic formed by three MOS transistors. A first MOS transistor 122 comprises its source and its drain respectively connected to the photodiode 106 and to a VDD potential. A second MOS transistor 124 comprises its drain connected to the VDD potential, its source being connected to the drain of the transistor 110 for selecting pixel line which forms the third MOS transistor of said pixel of 3T type.

The gate of the second transistor 124 is connected to the source of the first transistor 122.

The first MOS transistor 122 here forms a means of charging and discharging the photodiode 106 and makes it possible to reinitialise the pixel when said first MOS transistor 122 is turned on, the voltage at the terminals of the junction capacitance of the photodiode 106 being put at VDD.

The second MOS transistor 124 forms a voltage follower carrying out a conversion of the charges stored in the junction capacitance of the photodiode 106 into a voltage. Finally, the MOS transistor 110 for selecting pixels makes it possible to output, when the line on which said pixel 104 is positioned is addressed, in other words by turning on said MOS transistor 110, the voltage supplied by the second MOS transistor 124 on the bus 118.

The pixel 104 represented in FIG. 2 forms an active pixel because its reading circuit 108 carries out both the reading of the charges generated by the photodiode 106 and an amplification of the signal read by way of the second MOS transistor 124 which forms a voltage follower and which converts the charges generated by the photodiode 106 into a voltage.

In a variant, it is possible that the pixel 104 represented in FIG. 2 does not comprise the MOS transistor 110 for selecting pixel line.

In this case, the function of pixel line selection is fulfilled by the first MOS transistor 122, the discharge of the photodiode 106 only occurring when it is aimed to address the line of pixels on which said pixel 104 is positioned.

A second embodiment example of a pixel 104 comprising a photodiode 106 and a reading circuit 108 connected to the photodiode 106 and to the MOS transistor 110 for selecting pixel line is represented in FIG. 3.

In this second example, the pixel 104 is an active pixel of CTIA (capacitive transimpedance amplifier), or charge amplifier, type.

The photodiode 106 is connected to the negative input of a charge amplifier 126, a polarisation voltage being applied to the positive input of the charge amplifier 126.

The output of the charge amplifier 126 is connected to its negative input by way of a capacitance 128 and a first MOS transistor 130, said two components being connected in parallel to each other.

The output of the charge amplifier 126 is also connected to the source of the MOS transistor 110 for selecting pixel line.

The first MOS transistor 130 here forms a means of charging and discharging the capacitance 128.

Unlike the pixel 104 described previously with reference to FIG. 2 in which the charges/voltage conversion is performed thanks to the capacitance at the terminals of the photodiode and the voltage follower, the charges/voltage conversion is here performed by the charge amplifier 126 associated with the capacitance 128. Finally, the MOS transistor 110 makes it possible to output, when the line on which said pixel 104 is positioned is addressed by turning on the first MOS transistor 110, the voltage which is at the output of the charge amplifier 126 on the bus 118.

As for the pixel 104 represented in FIG. 2, the pixel 104 represented in FIG. 3 also forms an active pixel.

Here again, in a variant, it is possible not to form the MOS transistor 110 for selecting pixel line, this role being able to be fulfilled by the first MOS transistor 130, in an analogous manner to the first MOS transistor 122 as described previously.

A third embodiment example of a pixel 104 comprising a photodiode 106 and a reading circuit 108 connected to the photodiode 106 and to the first MOS transistor 110 for selecting pixel line is represented in FIG. 4.

In this third example, the pixel 104 is an active pixel of 4T type, in other words comprising an analog electronic formed by four MOS transistors.

In an analogous manner to the first example of reading circuit 108 described previously with reference to FIG. 2, the reading circuit 108 represented in FIG. 4 comprises the first MOS transistor 122 and the second MOS transistor 124, the roles of which are similar to those described previously with reference to the example of FIG. 2.

Compared to the pixel of FIG. 2, the pixel 104 of this third embodiment example of pixel 104 moreover comprises an additional MOS transistor 132 laid out between the photodiode 106 and the reading circuit 108.

Said MOS transistor 132 assures isolation between the reading circuit 108 and the photodiode 106, and makes it possible to carry out directly the integration of the charges generated by the photodiode 106 during the discharge of the junction capacitance of the photodiode 106 without having to reinitialise the photodiode 106 to obtain the measure made by the pixel.

Figure 5:
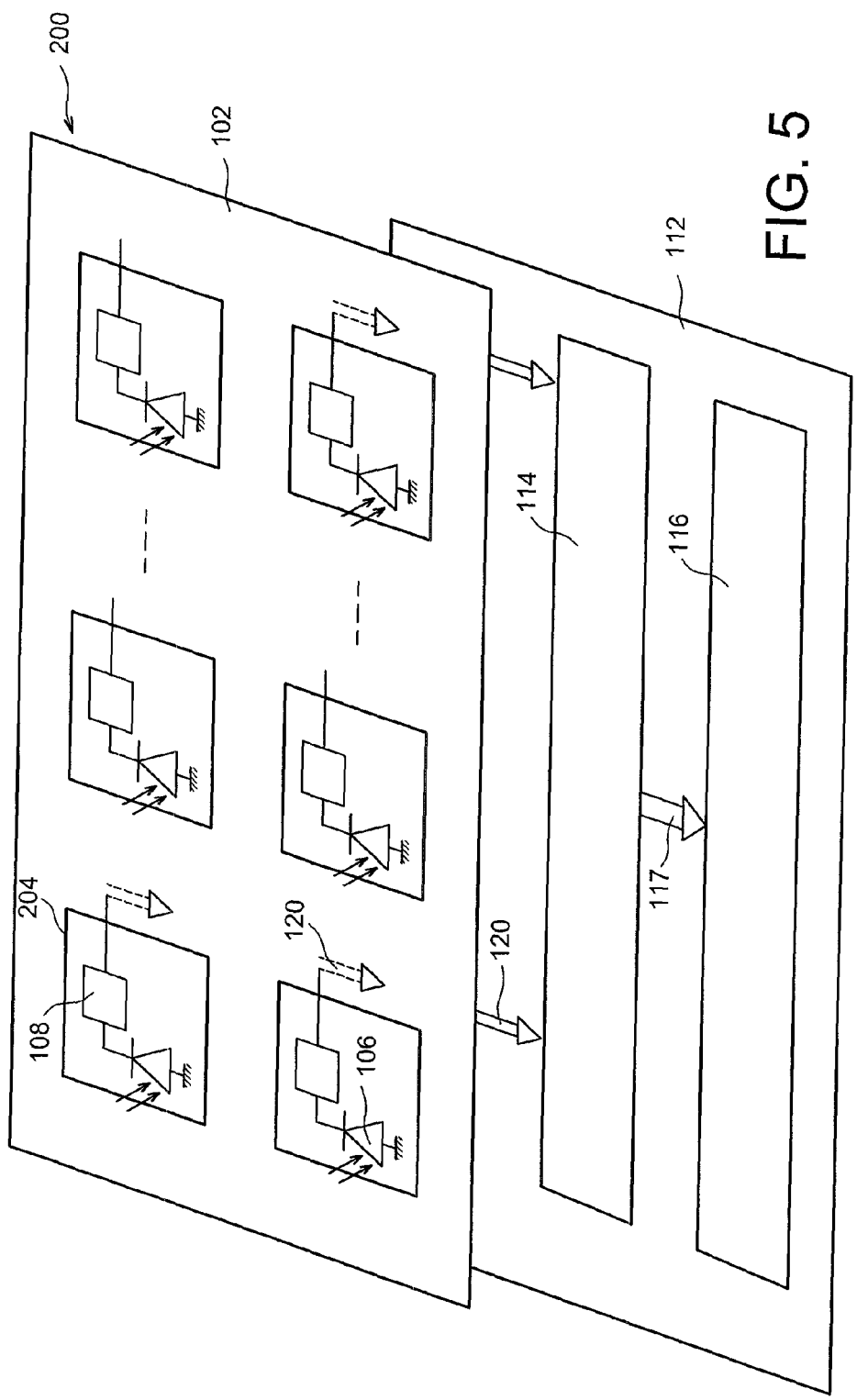

Reference is made to FIG. 5 which schematically and partially represents an imaging device 200 according to a second embodiment.

Compared to the imaging device 100 according to the first embodiment described previously with reference to FIG. 1, the pixels 204 of the imaging device 200 do not comprise an MOS transistor 110 for selecting pixel line, and the output of each reading circuit 108 of each pixel 120 is directly connected to an electrical interconnection 120 forming a direct electrical link between said pixel output 204 and the multiplexing circuit 114. Thus, in this second embodiment, the multiplexing circuit 114 comprises as many inputs as pixels 204, and comprises an electronic making it possible to carry out the multiplexing of the voltages coming from the series of pixels 204 which are sent simultaneously in input of the multiplexing circuit 114.

The different embodiment examples of pixels 104 described previously with reference to FIGS. 2 to 4 can apply for the formation of the pixels 204 of the imaging device 200, the only difference being the absence of the MOS transistor 110 for selecting pixel line.

Figure 6:
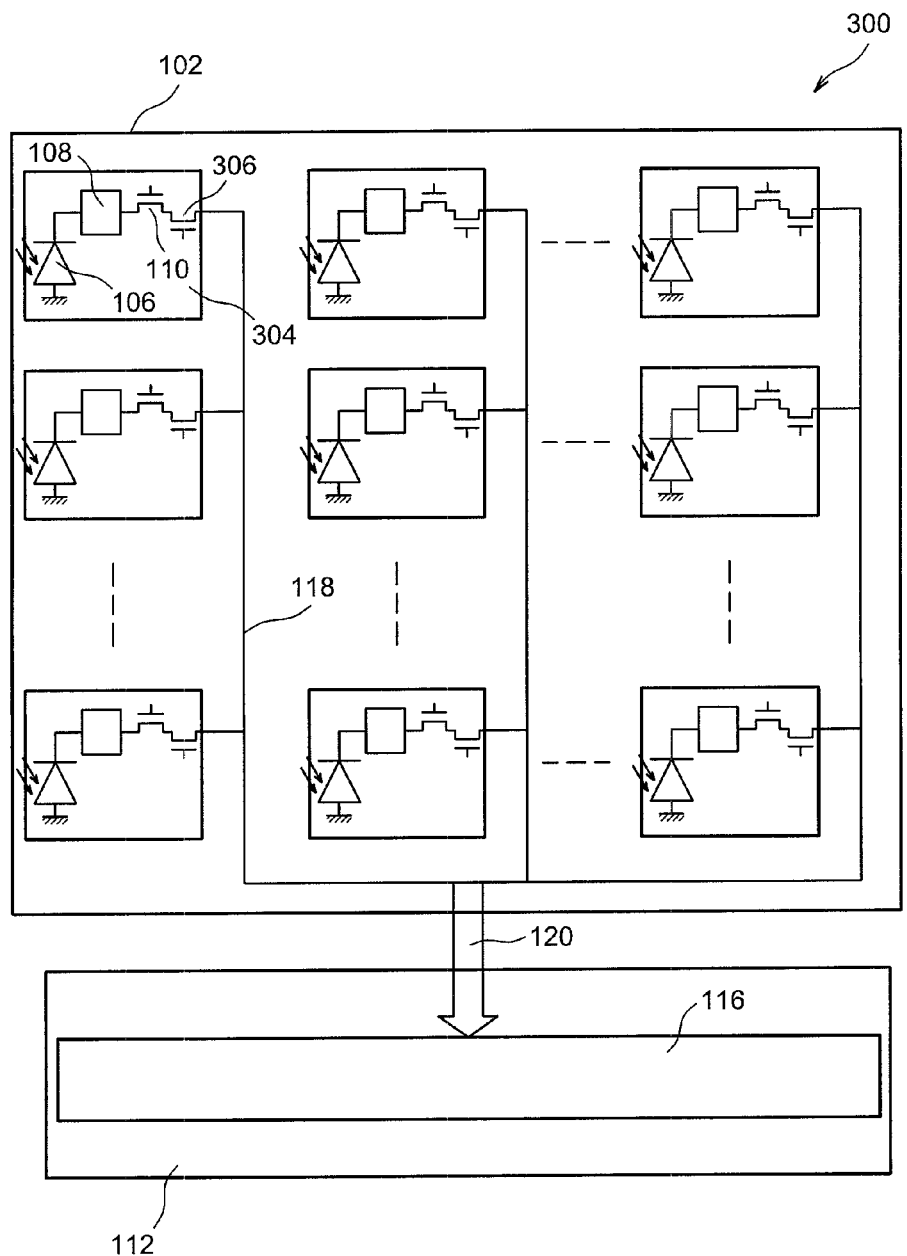

Reference is now made to FIG. 6, which schematically and partially represents an imaging device 300 according to a third embodiment.

Unlike the imaging device 100 described previously with reference to FIG. 1, each pixel 304 of the imaging device 300 comprises another MOS transistor 306 for selecting pixels, serving to select one of the columns of pixels 304. Thus, each pixel 304 of a macropixel of the imaging device 300 may be addressed individually by turning on the MOS transistors 110 and 306 of the pixel in question. Given that the imaging device 300 makes it possible to perform an individual addressing of the pixels 304, the buses 118 of a same macropixel are electrically connected to each other and the electrical link of a macropixel with the second substrate 112 is formed by way of a single electrical interconnection 120. In addition, the electrical interconnection 120 is directly connected to the electronic processing circuit 116, the multiplexing circuit used in the imaging devices 100 and 200 no longer having usefulness here given that the measures made by the pixels 304 of a same macropixel are sent sequentially, pixel by pixel, into the electronic processing circuit 116 associated with this macropixel. The different embodiment variants of the reading circuits 108 described previously with reference to FIGS. 2 to 4 also apply to the imaging device 300.

Figure 7:
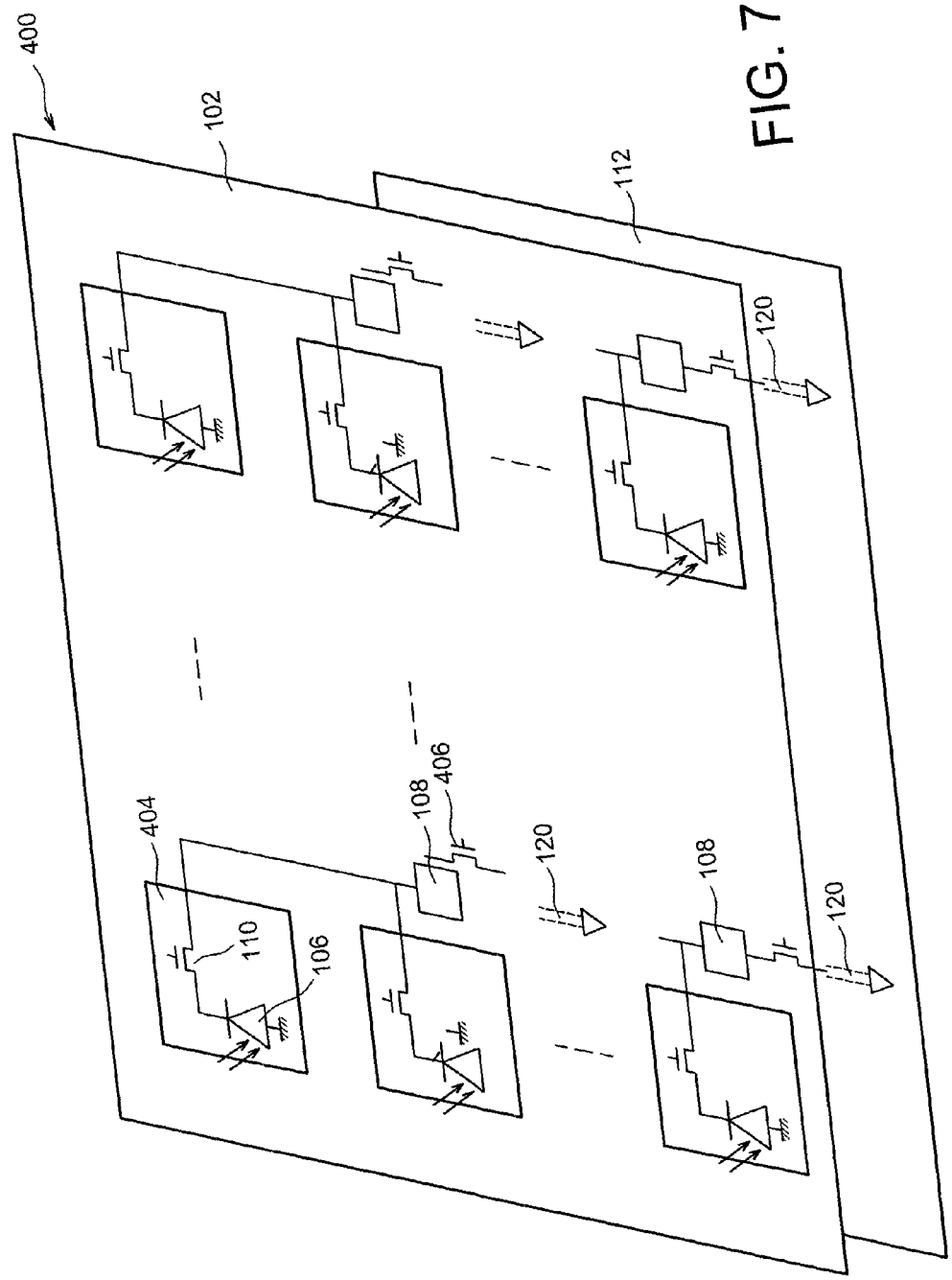

Reference is now made to FIG. 7, which schematically and partially represents an imaging device 400 according to a fourth embodiment.

Compared to the imaging device 100 according to the first embodiment described previously with reference to FIG. 1, the pixels 404 of the imaging device 400 are passive pixels of 1T type. In fact, each pixel 404 comprises a photodiode 106 and a MOS transistor 110 for selecting pixel line.

In addition, unlike the pixels 104 of the imaging device 100, the pixels 404 of the imaging device 400 do not comprise reading circuits formed within the pixels 404 themselves. In order to carry out the charges/voltage conversion of the output signals of the photodiodes 106, the imaging device 400 comprises reading circuits 108 common to several pixels 404. In the example of FIG. 7, each reading circuit 108 is common to two pixels 404. Preferably, care will be taken not to connect more than three pixels 404 to a same reading circuit 108.

Thanks to the transistors MOS 110 for selecting pixel line present in each pixel 404, the reading circuit 108 does not receive simultaneously the charges outputted by the two photodiodes 106 which are connected to the reading circuit 108. An output of the reading circuit 108 is connected to another MOS transistor 406 serving as means for selecting pixel column.

The voltages obtained at the output of the reading circuits 108 are then sent into the processing circuit 116 by the interconnections 120. In the example of FIG. 7, each reading circuit 108 is connected to an interconnection 120 which is specific to it. Nevertheless, given that the pixel selection is performed at the level of the first substrate (by the MOS transistors 110 and 406), it is possible to connect a part or the totality of the sources of the transistors 406 together, connecting together the outputs of the reading circuits 108, in order to minimise the number of interconnections 120 to be made between the first substrate 102 to the second substrate 112.

The reading circuits described previously with reference to FIGS. 2 to 4 may be used to form the reading circuits 108 of the imaging device 400.

Although in all the embodiments described previously, each macropixel is associated with a distinct electronic processing circuit, it is possible that one or more electronic processing circuits 116 and/or one or more multiplexing circuits 114 are common to several macropixels of the imaging device.

The invention claimed is:

1. An imaging device, comprising:
   a first substrate and a second substrate distinct from the first substrate;
   a plurality of macropixels, each macropixel of the plurality of macropixels comprising a plurality of pixels formed on the first substrate, each pixel of the plurality of pixels comprising at least one photodetector, the plurality of pixels being arranged according to a matrix comprising lines and columns;
   pixels lines selection means for sequentially selecting pixels belonging to a same column of the matrix;
   a plurality of analog reading circuits formed on the first substrate and associated with the plurality of pixels, each analog reading circuit of the plurality of analog reading circuits comprising one first MOS transistor configured to reset a pixel associated with the analog reading circuit, and a circuit configured to convert charges outputted by the photodetector into an analog voltage, and comprising a second MOS transistor, the gate of which is connected to the photodetector and a source or a drain of which is connected to one of a plurality of connection buses formed on the first substrate; and
   a plurality of electronic processing circuits configured to process analog voltages outputted by the analog reading circuits, the electronic processing circuits being formed on the second substrate, wherein
   for each macropixel of the plurality of macropixels, the outputs of the pixels of said same column of the matrix are linked electrically one to the others by one of the plurality of connection buses, the second substrate is linked electrically to the first substrate by at least one electrical interconnection forming an electrical link between the at least one of the connection buses and one of the electronic processing circuits, each connection bus being linked to only one electrical interconnection.

2. The imaging device according to claim 1, in which each pixel further comprises at least one MOS isolation transistor formed on the first substrate, between the photodetector of the pixel and the analog reading circuit associated with the photodetector.

3. The imaging device according to claim 1, in which each pixel comprises one of the analog reading circuits distinct from the analog reading circuits of the other pixels.

4. The imaging device according to claim 1, further comprising at least one multiplexing circuit formed on the second substrate, and in which the electrical interconnections electrically connect the connection buses to inputs of the multiplexing circuit.

5. The imaging device according to claim 1, in which the pixels lines selection means comprise the first MOS transistor of the analog reading circuit or another MOS transistor formed on the first substrate and arranged between the analog reading circuit of the pixel and the connection bus to which the pixel is connected.

6. The imaging device according to claim 1, in which several pixels are electrically connected to a same analog reading circuit, each pixel comprising first pixel selection means arranged between the photodetector of the pixel and the analog reading circuit, an output of the analog reading circuit being connected to second means of selecting pixels cooperating with the first pixel selection means so that each electronic processing circuit receives successively in input the voltages configured to be outputted by the analog reading circuits.

7. The imaging device according to claim 1, in which the electronic processing circuits are configured to carry out at least one analog/digital conversion of the analog voltages outputted by the analog reading circuits.

8. The imaging device according to claim 1, in which, for each macropixel of the plurality of macropixels, the connection buses are linked electrically one to the others and to the same electrical interconnection, and further comprising, for each analog reading circuit of the plurality of analog reading circuits, a column selection MOS transistor formed on the first substrate, between said each analog reading circuit and the connection bus to which said each analog reading circuit is linked.

9. The imaging device according to claim 1, in which, for each macropixel of the plurality of macropixels, each connection bus of the plurality of connection buses is linked electrically to an electrical interconnection distinct from the at least one electrical interconnection linked to the other connection buses of the plurality of connection buses.

* * * * *